(12) United States Patent
Kobashi et al.

(10) Patent No.: US 7,164,190 B2
(45) Date of Patent: Jan. 16, 2007

(54) FIELD EFFECT TRANSISTOR

(75) Inventors: Masahiro Kobashi, Kanagawa (JP); Keishin Handa, Mie (JP); Shinji Aramaki, Kanagawa (JP); Yoshimasa Sakai, Kanagawa (JP)

(73) Assignee: Mitsubishi Chemical Corporation, Tokyo (JP)

( * ) Notice: Subject to any disclaimer, the term of this patent is extended or adjusted under 35 U.S.C. 154(b) by 125 days.

(21) Appl. No.: 11/045,157

(22) Filed: Jan. 31, 2005

(65) Prior Publication Data

US 2005/0145995 A1 Jul. 7, 2005

Related U.S. Application Data

(63) Continuation of application No. PCT/JP03/009747, filed on Jul. 31, 2003.

(30) Foreign Application Priority Data

Jul. 31, 2002 (JP) .............................. 2002-223021

(51) Int. Cl.
*H01L 23/58* (2006.01)

(52) U.S. Cl. .................... 257/642; 257/40; 438/82; 438/999

(58) Field of Classification Search .................. 257/40, 257/E39.7, E51.1; 438/82, 99
See application file for complete search history.

(56) References Cited

U.S. PATENT DOCUMENTS 5,342,468 A * 8/1994 Kawazoe et al. ........... 156/233
5,347,144 A   9/1994 Garnier et al.
5,854,139 A   12/1998 Aratani et al.
6,433,359 B1 * 8/2002 Kelley et al. ................. 257/40
2002/0195604 A1 * 12/2002 Segawa et al. ............... 257/72

FOREIGN PATENT DOCUMENTS

| JP | 61-202469   | 9/1986 |
| JP | 8-18125     | 1/1996 |
| JP | 2984370     | 9/1999 |
| JP | 2001-94107  | 4/2001 |
| JP | 2001-244467 | 9/2001 |

OTHER PUBLICATIONS

John A. Rogers, et al., *Paper-Like Electronic Displays: Large-Area Rubber-Stamped Plastic Sheets of Electronics and Microencapsulated Electrophoretic Inks*, PNAS Apr. 24, 2001. vol. 98, No. 9, pp. 4835-4840, www.pnas.org/cgi/doi/10.1073/pnas.091588098.

* cited by examiner

*Primary Examiner*—Zandra V. Smith
*Assistant Examiner*—Thanh Y. Tran
(74) *Attorney, Agent, or Firm*—Oblon, Spivak, McClelland, Maier & Neustadt, P.C.

(57) ABSTRACT

A field effect transistor comprising, as provided on a support substrate, an insulation layer, a gate electrode and an organic semiconductor layer separated by the insulation layer, a source electrode and a drain electrode provided so as to contact the organic semiconductor layer, wherein elongation $\epsilon 1$ (%) at the yield point of the insulation layer is larger than elongation $\epsilon 2$ (%) at the yield point of the support substrate.

12 Claims, 8 Drawing Sheets

PET/PS

Before bending

After bending

PET/CYEPL

Before bending

After bending

PI/PS

Before bending

After bending

PI/CYEPL

Before bending

After bending a: Before bending
b: After bending

PET

PS
*

CYEPL
10% decrease

PC
3% decrease

Low Cross-linked PVP
*

*Not measurable

*Not measurable

PI

PS
*

CYEPL
10% decrease

PC
4% decrease

Low cross-linked PVP
7% decrease

*Dielectric breakdown at VG=-6V

Highly cross-linked PVP →

*Not measurable

FIELD EFFECT TRANSISTOR

TECHNICAL FIELD

The present invention relates to a field effect transistor employing an organic semiconductor.

BACKGROUND ART

Like bipolar transistors, field effect transistors are widely used as important switches or amplifying elements. A field effect transistor has a structure wherein a semiconductor material is provided with a source electrode and a drain electrode, and via an insulation layer, a gate electrode. The operating characteristics of a field effect transistor are determined by the carrier mobility μ of the semiconductor to be used, the electrical conductivity σ, the electrical capacitance Ci of the insulation layer and the construction of the element (distance L and width W between the source electrode and the drain electrode, the thickness d of the insulation layer, etc.). With respect to the characteristics of the semiconductor material among them, one having a high mobility (μ) shows good characteristics.

At present, silicon is widely used as such a semiconductor material. An inorganic semiconductor represented by silicon is required to be treated at a high temperature of at least 300° C. during the production, whereby it is difficult to employ a plastic substrate or film as the substrate, and it has a drawback such that a large energy is required for the production. Further, it requires an element preparation process in vacuum, whereby an expensive installation is required for the production line, thus leading to a drawback of high costs.

Whereas, a transistor employing an organic semiconductor can be produced by a lower temperature process than the inorganic semiconductor in most cases, whereby it is possible to employ a plastic substrate or film as the substrate, and it is possible to prepare an element which is light in weight and scarcely breakable. Further, there may be some whereby an element can be prepared by employing a printing method or coating of a solution, and it is possible to produce an element having a large area at a low cost. Further, the material is rich in variation, and it is possible to easily basically change the characteristics of the material by changing the molecular structure, and accordingly, by combining different functions, it is also possible to realize an element having a function which can not be attainable by an inorganic semiconductor.

With respect to a transistor employing an organic semiconductor as the semiconductor, JP-A-61-202469 discloses one employing a conductive polymer or a conjugated polymer, and Japanese Patent 2,984,370 discloses one employing a low molecular weight compound.

Typical structures of conventional transistors employing an organic semiconductor as the semiconductor, are shown in FIGS. 1 to 3.

In the field effect transistor in FIG. 1, a gate electrode 2 is provided on a support substrate 1, and further, an insulation layer 3 and an organic semiconductor layer 4 are provided thereon. So as to contact the organic semiconductor layer 4, a source electrode 5 and a drain electrode 6 are provided on the insulation layer 3. This field effect transistor is referred to as a bottom gate/bottom contact type.

The field effect transistor in FIG. 2 is different from the field effect transistor shown in FIG. 1 in that a source electrode 5 and a drain electrode 6 are provided on an organic semiconductor layer 4 on an insulation layer 3, and it has the same construction except for this difference. This field effect transistor is referred to as a bottom gate/top contact type.

In the field effect transistor shown in FIG. 3, a source electrode 5 and a drain electrode 6 are provided on a support substrate 1, and an organic semiconductor layer 4 and an insulation layer 3 are laminated on the support substrate 1, and a gate electrode 2 is provided on the insulation layer 3. This field effect transistor is referred to as a top gate/bottom contact type.

With such field effect transistors, when a voltage is applied to the gate electrode 2, the carrier density in the organic semiconductor layer 4 will be changed in the vicinity of the interface between the organic semiconductor layer 4 and the insulation layer 3, thereby to change the electric current flowing between the source and drain electrodes 5 and 6.

In such a field effect transistor employing an organic semiconductor (hereinafter sometimes referred to as "an organic filed effect transistor"), as mentioned above, when a plastic substrate or film is employed as the support substrate, it is possible to realize a transistor which is flexible and scarcely breakable. Such an organic field effect transistor may be used as a switching element in a flexible display, as disclosed in Bell Lab. Lucent Technologies, PNAS., 98,4835.

However, even in a case where a plastic substrate or film is employed as the support substrate, if, for example, there is a substantial difference in the mechanical characteristics between the support substrate and e.g. the insulation layer, it is likely that when a stress is exerted to the organic field effect transistor, the support substrate may be deformed and then return to the initial shape when the stress is lifted, but the insulation layer may not return to the initial shape, whereby the function as the element may be destroyed. However, no detailed study has been carried out with respect to the mechanical characteristics as such a flexible element, and the characteristics of the element.

DISCLOSURE OF THE INVENTION

The present invention has been made under the above mentioned circumstances, and it is an object of the present invention to optimize the mechanical characteristics of the support substrate and the insulation layer which occupy a large area as constituting components of a switching element in a flexible display and which are susceptible to a mechanical influence, thereby to attain a high mobility, a high on-current and a low leak current, and a high on/off ratio in the organic field effect transistor, and to provide an organic field effect transistor having such transistor characteristics stabilized.

The field effect transistor of the present invention comprises an insulation layer, a gate electrode and an organic semiconductor layer separated by the insulation layer, a source electrode and a drain electrode provided so as to contact the organic semiconductor layer, and a support substrate containing a polymer, wherein elongation $\epsilon 1$ (%) at the yield point of the insulation layer is larger than elongation $\epsilon 2$ (%) at the yield point of the support substrate.

As mentioned above, in a case where a plastic substrate or film is used as a support substrate in an organic field effect transistor, it is possible to obtain a transistor which is flexible and scarcely breakable. The present inventors have found that with an organic field effect transistor having a support substrate and an insulation layer to be used for a flexible display, in order to effectively obtain the flexible characteristics of the support substrate, not only the flexibility of the support substrate itself but also a combination of the support substrate and the insulation layer is important so as to obtain physical properties such that when a stress is exerted, the insulation layer follows the flexing of the support substrate, and when the stress is removed, they return to the initial shapes.

According to the present invention, such physical properties can sufficiently be obtained by adopting a combination whereby elongation $\epsilon 1$ (%) at the yield point of the insulation layer is larger than elongation $\epsilon 2$ (%) at the yield point of the support substrate, preferably the ratio ($\epsilon 1/\epsilon 2$) of this elongation $\epsilon 1$ (%) to the elongation $\epsilon 2$ (%), is larger than 1 and at most 15.

Such physical properties are considered to be related with "elongation $\epsilon$ (%) at the elastic limit (at which the material returns to the initial point in the stress-distortion coordinates when the stress is removed)". However, it is difficult to measure such "elongation at the elastic limit". Accordingly, in the present invention, "elongation $\epsilon$ (%) at the yield point" which substantially corresponds to the "elongation at the elastic limit", is used as a parameter. Thus, in the present invention, the relation of "elongation $\epsilon$ (%) at the yield point" between the support substrate and the insulation layer, is specified, but essentially, it represents the relation of "elongation at the elastic limit".

In the present invention, the yield point at which the elongation is to be measured, is as follows. Namely, if the stress exerted to the support substrate or the insulation layer is increased and when it reaches a certain point beyond the elastic limit, the plastic strain abruptly increases with no substantial increase in the stress. This point is the yield point (the yield stress). In the present invention, the elongation % at this yield point is defined with respect to the support substrate and the insulation layer.

The "elongation at a yield point" in the present invention is one obtained in accordance with JIS K7113 by preparing a test specimen having the same thickness and the same size with respect to each of the support substrate and the insulation layer. Namely, a pure tensile stress is exerted to a material at a prescribed strain rate (or loading speed) to obtain the relation between the tensile stress and the elongation strain of the material, and the yield point is obtained from this tensile stress-strain curve, and the elongation (%) at the yield point is specified to obtain the "elongation at the yield point".

In the present invention, the insulation layer has a good flexible characteristic such that when a stress is exerted to the organic field effect transistor, the insulation layer sufficiently follows the flexing of the support substrate and, when the stress is removed, regains the original shape to maintain the initial shape. Accordingly, cracking, etc. caused by the stress will be suppressed, whereby a leak current will be reduced, and a high mobility, a high on-current and a low leak current, and a high on/off ratio, can be attained.

Figure 1:
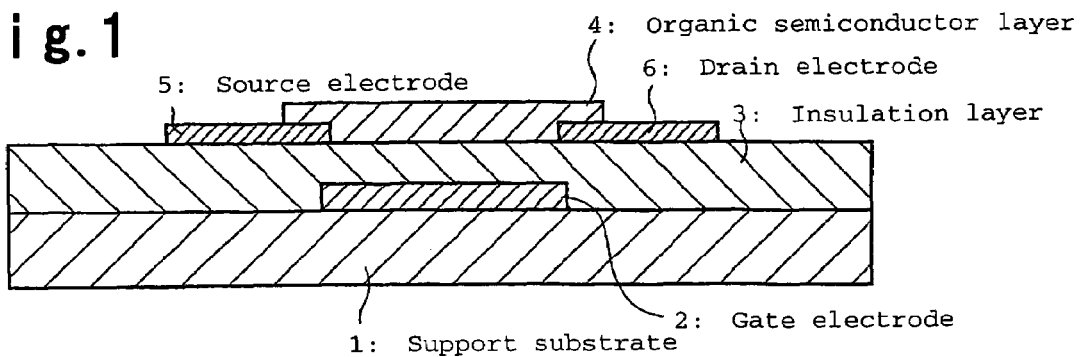
FIG. 1 is a cross sectional view illustrating an example of the structure of a field effect transistor.

MEANINGS OF SYMBOLS:

1 Support substrate
2 Gate electrode
3 Insulation layer
4 Organic semiconductor layer
5 Source electrode
6 Drain electrode
7 Interface

BEST MODE FOR CARRYING OUT THE INVENTION

Now, practical embodiments of the field effect transistor of the present invention will be described in detail with reference to the drawings.

Figure 2:
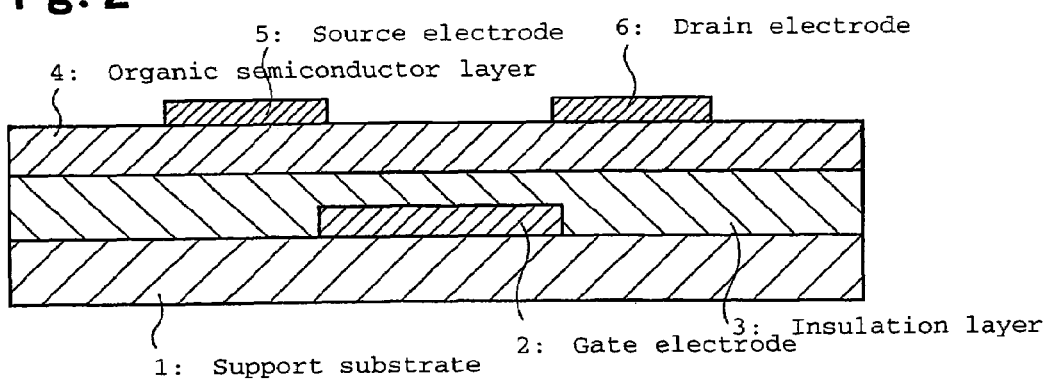
FIG. 2 is a cross sectional view illustrating an example of the structure of a field effect transistor.
Figure 3:
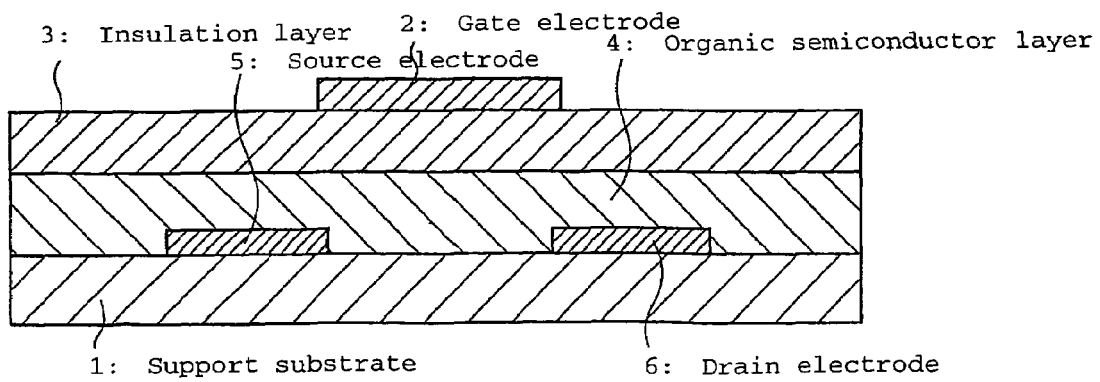
FIG. 3 is a cross sectional view illustrating an example of the structure of a field effect transistor.
Figure 4:
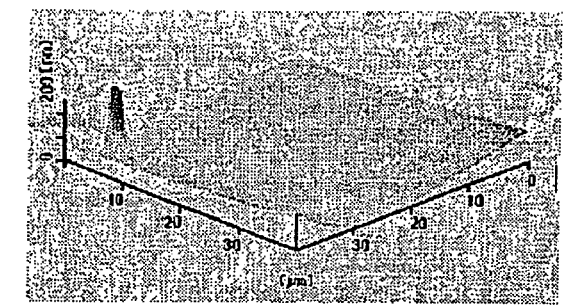
FIG. 4 is views showing the surface states before and after bending of a PET substrate provided with an insulation film.
Figure 4:
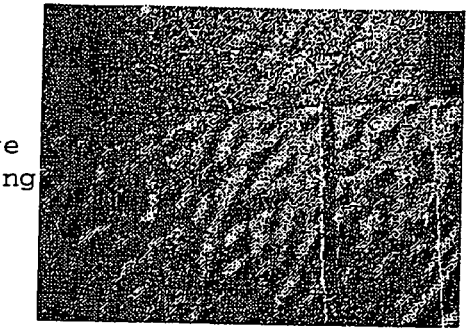
Figure 4:
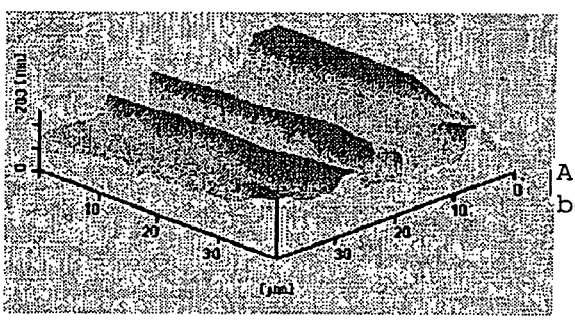
Figure 4:
Figure 4:
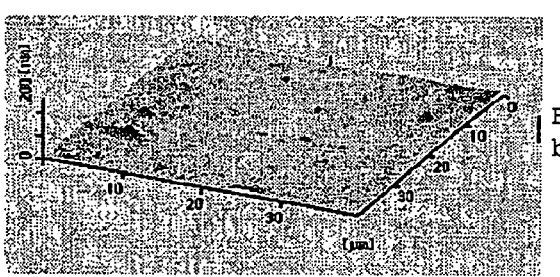
Figure 4:
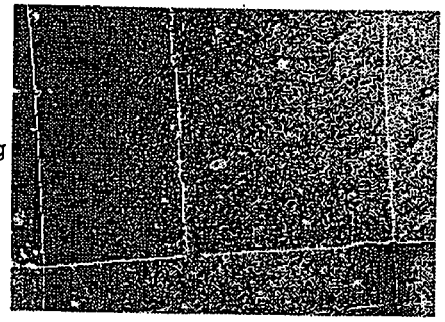
Figure 4:
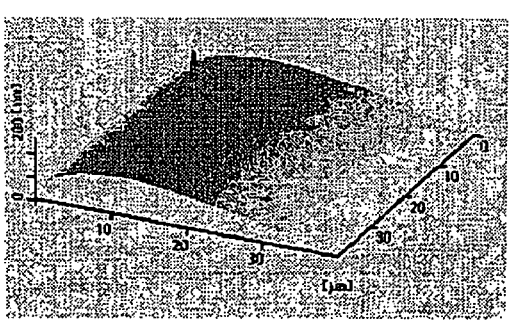
Figure 4:
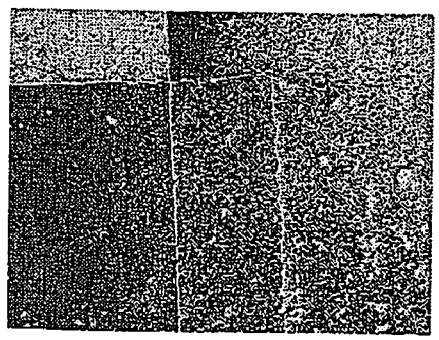
Figure 5:
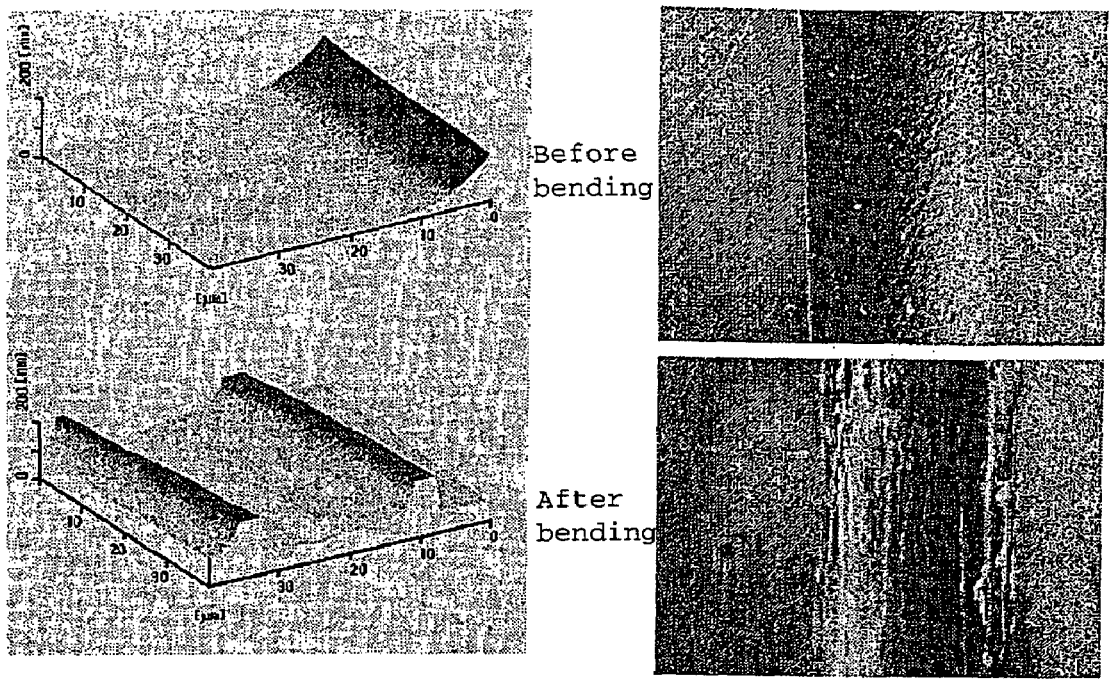
FIG. 5 is views showing the surface states before and after bending of a PI substrate provided with an insulation film.
Figure 5:
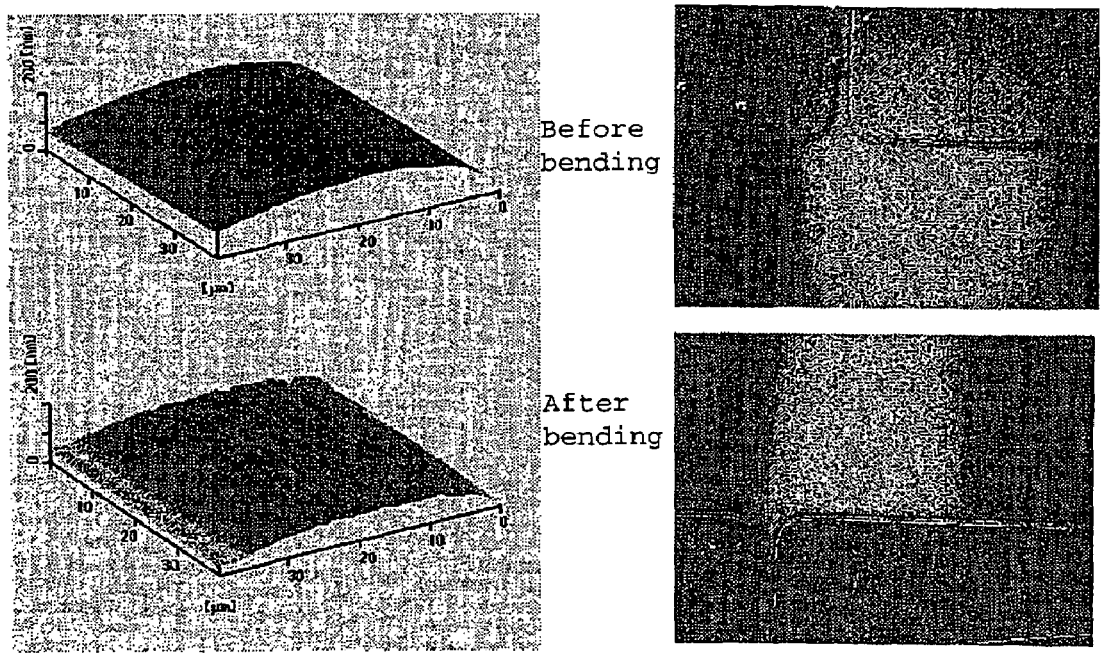
Figure 6:
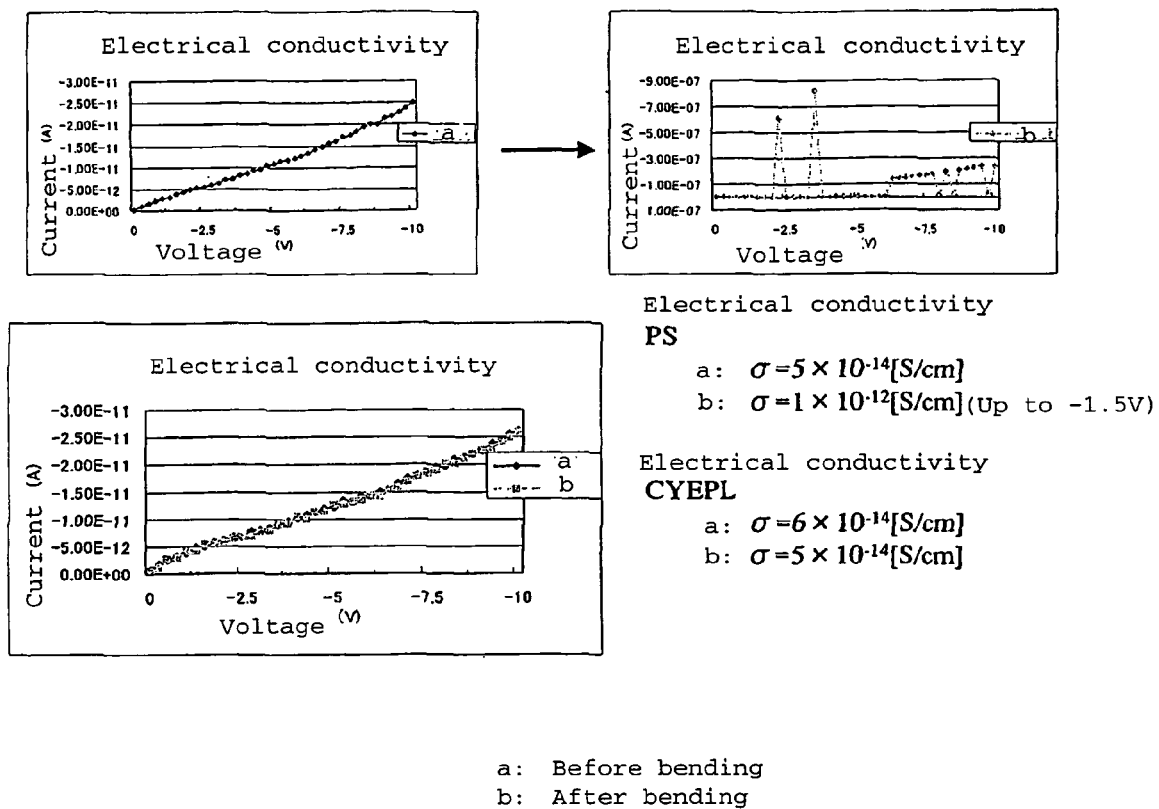
FIG. 6 shows the results of measurements of the electrical resistance of the insulation film by a bending test.
Figure 7:
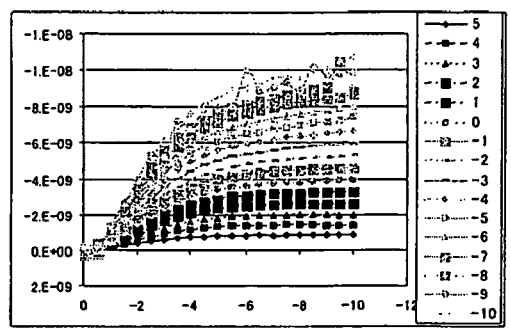
FIG. 7 is views showing a change in the characteristics of a PET substrate transistor by a bending test (1).
Figure 7:
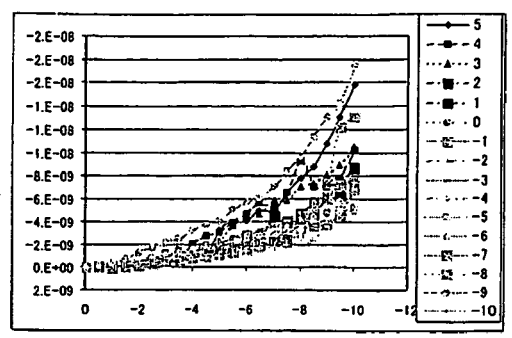
Figure 7:
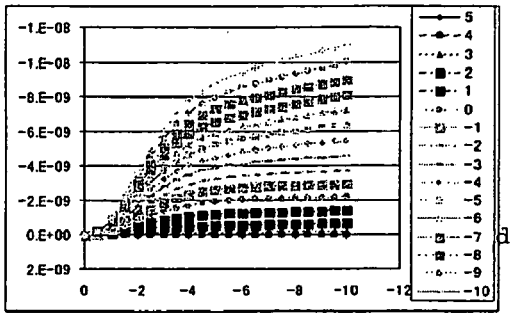
Figure 7:
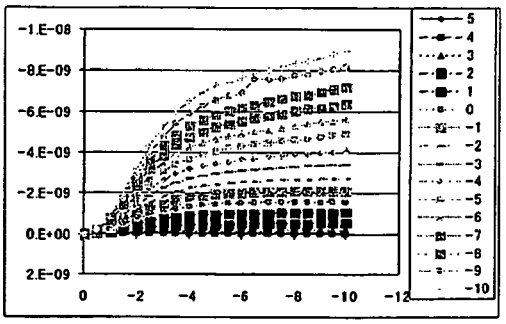
Figure 7:
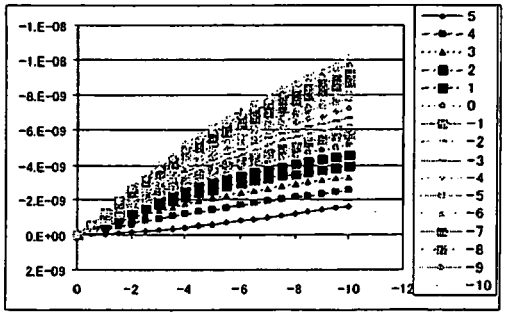
Figure 7:
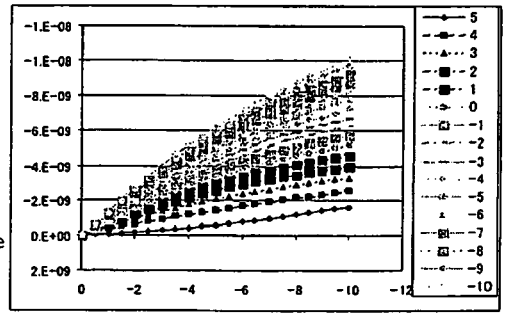
Figure 7:
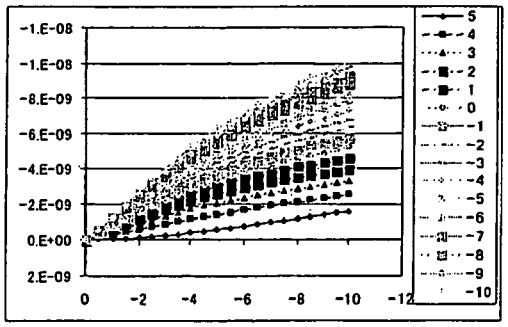
Figure 7:
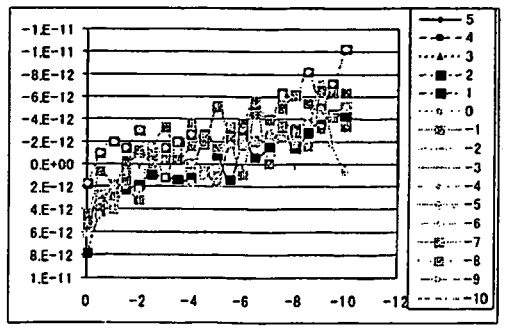
Figure 8:
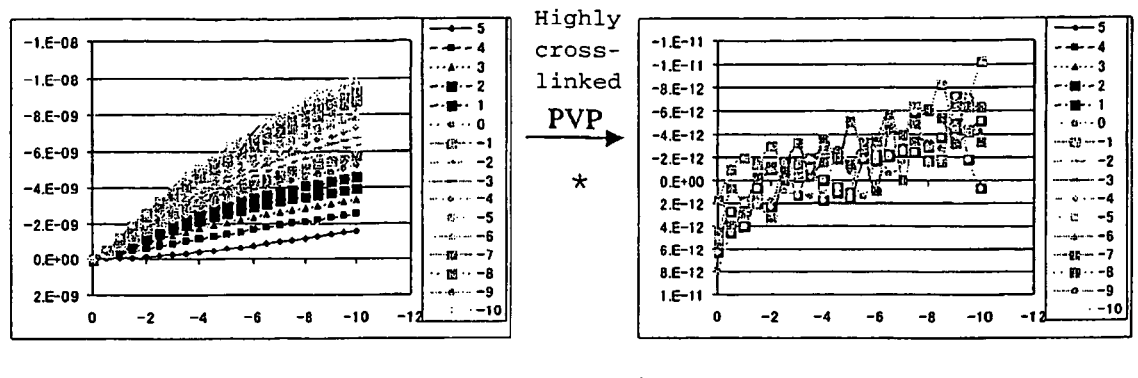
FIG. 8 is views showing a change in the characteristics of a PET substrate transistor by a bending test (2).
Figure 9:
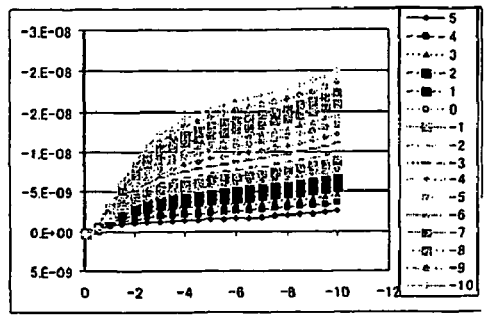
FIG. 9 is views showing a change in the characteristics of a PI substrate transistor by a bending test (1).
Figure 9:
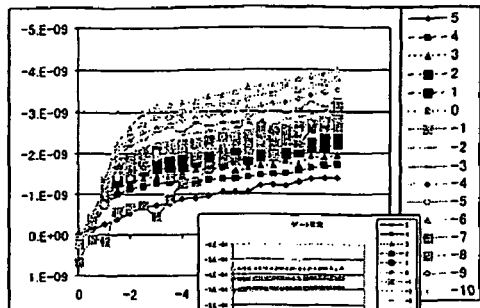
Figure 9:
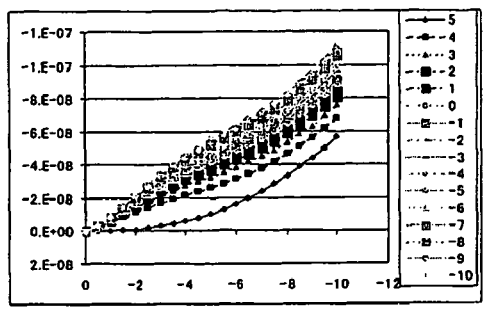
Figure 9:
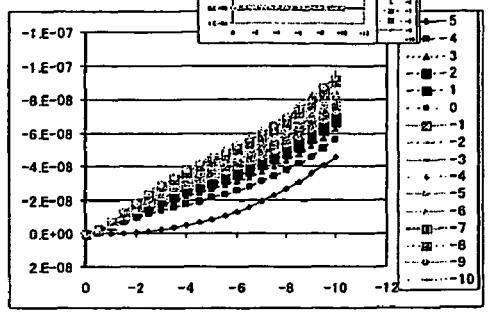
Figure 9:
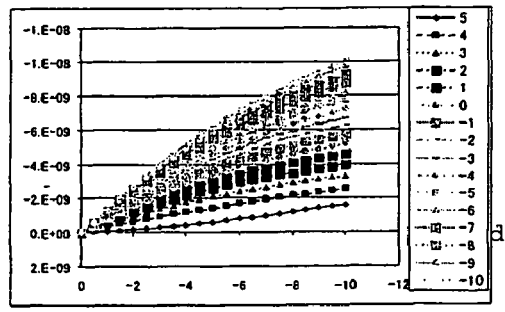
Figure 9:
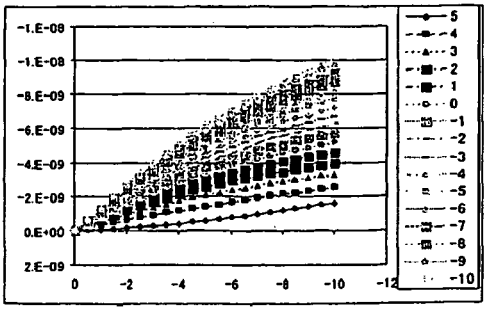
Figure 9:
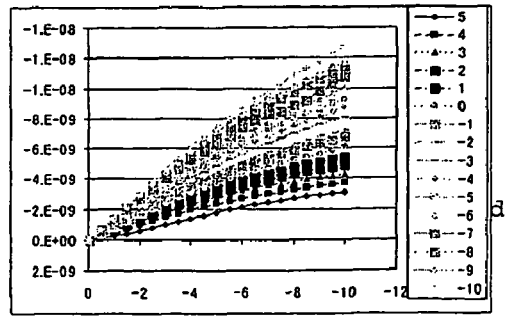
Figure 9:
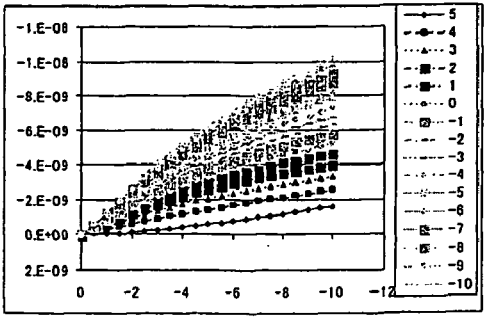
Figure 10:
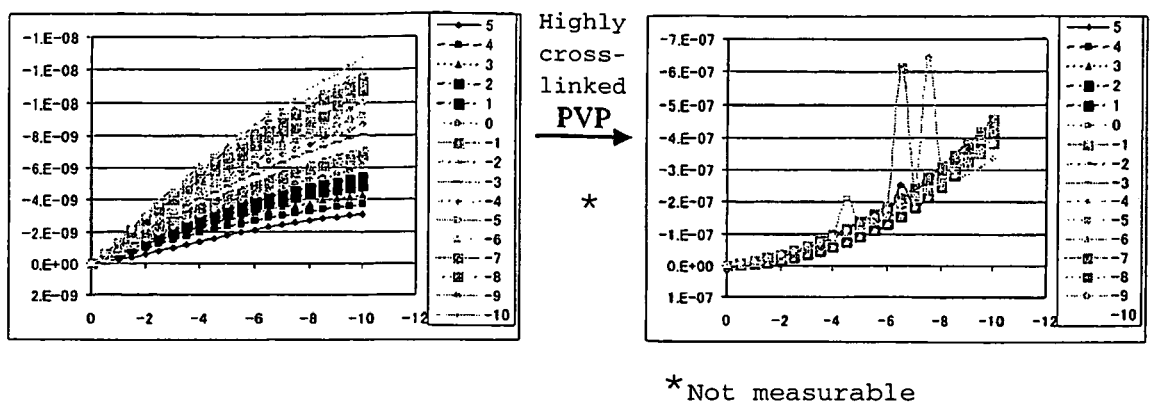
FIG. 10 is views showing a change in the characteristics of a PI substrate transistor by a bending test (2).
Figure 11:
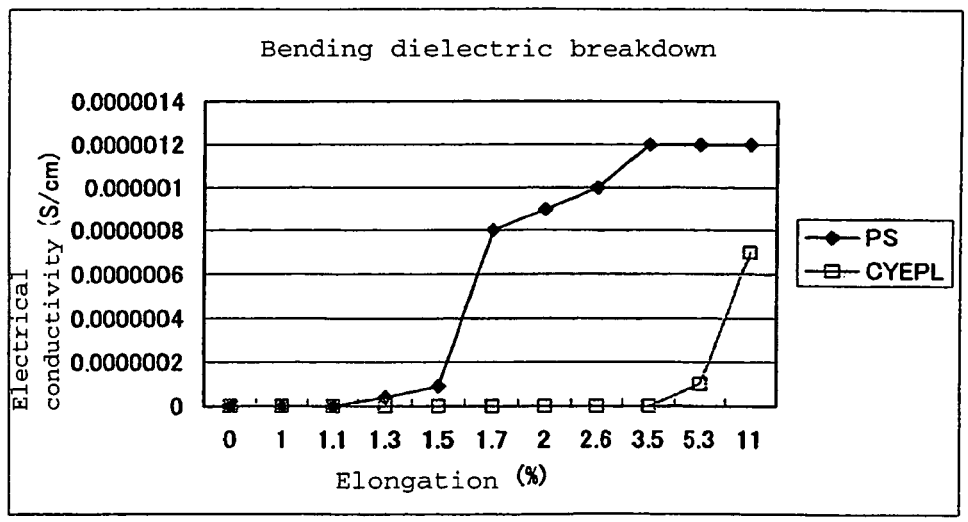
FIG. 11 is a graph showing the relation between the elongation and the insulation resistance at the yield point of an insulation film.

The field effect transistor of the present invention comprises, as provided on a support substrate, an insulation layer, a gate electrode and an organic semiconductor layer separated by the insulation layer, a source electrode and a drain electrode provided so as to contact the organic semiconductor layer. Its structure is not particularly limited and may, for example, be a bottom gate/bottom contact type as shown in FIG. 1, a bottom gate/top contact type as shown in FIG. 2 or a top gate/bottom contact type as shown in FIG. 3.

According to the present invention, in such a field effect transistor, elongation $\epsilon 1$ (%) at the yield point of the insulation layer is larger than elongation $\epsilon 2$ (%) at the yield point of the support substrate. Namely, $\epsilon 1 > \epsilon 2$, preferably the lower limit of the ratio ($\epsilon 1/\epsilon 2$) of elongation $\epsilon 1$ (%) at the yield point of the insulation layer to elongation $\epsilon 2$ (%) at the yield point of the support substrate, is larger than 1, more preferably at least 1.1. Further, the upper limit is not particularly limited, but preferably, it is at most 15, more preferably at most 13, further preferably at most 10, particularly preferably at most 5.

If elongation $\epsilon 1$ (%) at the yield point of the insulation layer is smaller than elongation $\epsilon 2$ (%) at the yield point of the support substrate, the insulation layer will not be able to sufficiently follow the flexing of the support substrate, and the restoration of the shape tends to be poor, whereby the object of the present invention can not be accomplished. Further, in a case where elongation $\epsilon 1$ (%) at the yield point of the insulation layer is the same as elongation $\epsilon 2$ (%) at the yield point of the support substrate, the insulation layer may follow the flexing of the support substrate, but a change in the insulation film is likely to result when the insulation film is partially stretched or deformed. If elongation $\epsilon 1$ (%) at the yield point of the insulation layer is excessively large as compared with elongation $\epsilon 2$ (%) at the yield point of the support substrate, the adhesion between the insulation layer and the support substrate or the electrodes, tends to be poor, and there may be a problem in maintaining the shape of the element.

In order to select the combination of the support substrate and the insulation layer so that it will be within the above mentioned range of the present invention, it is convenient to adjust the conditions for forming the insulation layer so that elongation $\epsilon 1$ at the yield point of the insulation layer becomes larger than elongation $\epsilon 2$ at the yield point of the support substrate. Specifically, a method may, for example, be mentioned wherein a curable resin composition is used as the material for the insulation layer, and the amount of an elastic component to be added to this composition, is adjusted.

The lower limit for elongation $\epsilon 1$ (%) at the yield point of the insulation layer is not particularly limited, but it is preferably at least 1%, more preferably at least 1.2%. The upper limit is not particularly limited, but it is preferably at most 25%, more preferably at most 10%. If elongation $\epsilon 1$ (%) at the yield point of the insulation layer is too small, it will not be able to follow the flexing of the support substrate, whereby cracking or peeling between the support substrate and the electrode semiconductor layer is likely to result. On the other hand, if it is too large, due to elongation by bending of the insulation layer, the support substrate, the electrodes and the semiconductor layer are likely to be peeled. Further, the lower limit for elongation $\epsilon 2$ (%) at the yield point of the support substrate is not particularly limited, but it is preferably at least 0.5%, more preferably at least 1%. The upper limit is not particularly limited, but it is preferably at most 20%, more preferably at most 8%. If elongation $\epsilon 2$ (%) at the yield point of the support substrate is too small, breakage is likely to result by bending, and it tends to be difficult to maintain the shape of the entire transistor, and if it is too large, due to elongation by bending of the support substrate, the insulation layer, the electrodes and the semiconductor layer are likely to be peeled.

In the present invention, the constituting materials for the field effect transistor themselves are not particularly limited, and those commonly used in conventional field effect transistors may suitably be employed.

In the present invention, the support substrate may be of a single layer or of laminated layers. In the case of laminated layers, however, elongation $\epsilon 2$ (%) at the yield point of the substrate closest to the insulation layer is required to be lower than elongation $\epsilon 1$ (%) at the yield point of the insulation layer.

The material for the support substrate may be any material which contains a polymer and which is capable of supporting a field effect transistor and a display element, a display panel, etc. to be formed thereon. Preferably, it is a plastic substrate selected from the group consisting of a polyester, a polycarbonate, a polyimide, an amorphous polyolefin, a polyether sulfone, an epoxy resin, a polyamide, a polybenzoxazole, a polybenzothiazole, a vinyl polymer, a polyparabanic acid, a polysilsesquioxane and a siloxane. Further, a polyester such as polyethylene terephthalate, or a general purpose resin such as polycarbonate, is preferred from the viewpoint of costs, and a condensed polymer such as polyimide, polyamide, polybenzoxazole, polybenzothiazole or polyparabanic acid, or a cross-linked body of e.g. polyvinylphenol which can be insolubilized by e.g. heat treatment, is preferred from the viewpoint of heat resistance or solvent resistance. Particularly preferred is a polyester, a polycarbonate, a polyimide or a polybenzoxazole, and most preferred is a polyester such as polyethyleneterephthalate, or a polyimide.

The material for the support substrate may be a copolymer or a blend containing the above polymer. Further, as the case requires, it may contain a filler, an additive, etc.

The material for the support substrate preferably has a glass transition temperature (Tg) of at least 40° C. If it is lower than 40° C., the fluidity tends to be so high that such is not suitable for a substrate. Further, it is preferably one showing solvent resistance against the solvent to be used for the preparation of the insulation layer. Further, it is preferably one having a linear expansion coefficient of at most $25 \times 10^{-5} \cdot cm \cdot cm^{-1} \cdot ° C.^{-1}$, more preferably at most $10 \times 10^{-5} \cdot cm \cdot cm^{-1} \cdot ° C.^{-1}$. If the linear expansion coefficient is larger than $25 \times 10^{-5} \cdot cm \cdot cm^{-1} \cdot ° C.^{-1}$, a dimensional change is likely to result by heat treatment during the preparation, whereby the transistor performance will not be stabilized. Further, it is preferably one having high adhesion with the insulation film and the electrodes.

The upper limit for the thickness of the support substrate is preferably at most 2 mm, more preferably at most 1 mm. Further, the lower limit is preferably at least 0.01 mm, more preferably at least 0.05 mm.

The material constituting the gate electrode, the source electrode and the drain electrode may be any one so long as it shows electrical conductivity, and any conventional one may be employed. It may, for example, be a metal such as platinum, gold, aluminum, chromium, nickel, copper, titanium, magnesium, calcium, barium or sodium, a conductive oxide such as $InO_2$, $SnO_2$ or ITO, a doped conductive polymer showing good electrical conductivity, such as a polyanilline doped with camphor sulfonic acid, or a polyethylene dioxy thiophene doped with paratoluene sulfonic acid, or a conductive composite material having carbon black, fine metal particles, graphite powder or the like dispersed in a binder and showing good electrical conductivity.

The method for forming the gate electrode, the source electrode and the drain electrode may, for example, be a vacuum vapor deposition method, a sputtering method, a coating method, a printing method or a sol-gel method. Further, its patterning method may, for example, be a photolithography method which is a combination of patterning with a photoresist and edging with an edging liquid or a reactive plasma, a printing method such as ink jet printing, screen printing, offset printing or relief printing, a soft lithography method such as micro contact printing, or a method having a plurality of such methods combined. Further, it is also possible to directly prepare a pattern by removing a material by irradiating energy rays such as a laser or an electron beam or by changing the electrical conductivity of the material.

The lower limit for the thickness of such a gate electrode, source electrode or drain electrode is preferably at least 0.01 μm, more preferably at least 0.02 μm. Whereas, the upper limit is preferably at most 2 μm, more preferably at most 1 μm.

Further, the distance between the source electrode and the drain electrode (channel length L) is usually at most 100 μm, preferably at most 50 μm, the channel width W is usually at most 2,000 μm, preferably at most 500 μm, and L/W is usually at most 0.1, preferably at most 0.05.

As the insulator for the insulation layer, any one of conventional ones may be employed so long as it has $\epsilon 1$ larger than $\epsilon 2$ and which is excellent in the insulating property and has a relatively large dielectric constant so that it is capable of preventing leakage of a current to the gate electrode and capable of driving the field effect transistor at a low gate voltage. It may, for example, be a polymer such as an acrylic resin such as polymethyl methacrylate, a polystyrene, a polyvinylphenol, a polyimide, a polycarbonate, a polyester, a polyvinylalcohol, a polyvinylacetate, a polyurethane, a polysulfone, an epoxy resin, a phenol resin, a polyvinylidene fluoride, or a hydrocarbon resin containing cyano groups or nitro groups, or a copolymer having these polymers combined, an oxide such as silicon dioxide, aluminum oxide or titanium oxide, a nitride such as silicon nitride, a ferroelectric oxide such as $SrTiO_3$ or $BaTiO_3$, or a polymer film having particles of the above oxide, nitride or ferroelectric oxide dispersed. Among them, an epoxy resin, a polyimide resin, an acrylic resin or a hydrocarbon resin containing cyano groups or nitro groups, is preferred. Preferred as the hydrocarbon resin containing cyano groups or nitro groups, is a polysaccharide wherein cyano group- or nitro group-substituted hydrocarbons are bonded to hydroxyl groups, and more preferred is cyanopullulan.

Further, as a precursor material for an insulator, a monomer may be coated and then irradiated with light for curing to obtain a photo-cured resin forming an insulator, or a polymer or monomer may be thermally cured by a cross-linking agent or cross-linking groups to obtain a cured resin. In such a case, by adjusting the amount of the elastic component to be incorporated, the elongation of the insulation layer may easily be adjusted within a desired range in correspondence with the support substrate, as mentioned above, such being desirable.

The insulation layer is not particularly limited, and it may be of a single layer or laminated layers. However, in order to use a highly dielectric insulation film stably, low dielectric insulation films may be laminated. In a case where the insulation layer is of laminated layers, the layer having the minimum elongation $\epsilon 1$ (%) at the yield point is required to be larger than the elongation $\epsilon 2$ (%) at the yield point of the support substrate.

The insulation layer preferably has a glass transition temperature (Tg) of at least 80° C. If Tg is lower than 80° C., an insulation layer can not be maintained, since the fluidity is high, the film thickness tends to be non-uniform, or the surface tends to have irregularities. Further, it is desired that it is soluble in a solvent which does not dissolve the support substrate, and it has solvent resistance so that it will not be eroded by a solvent at the time of preparation of a coating type semiconductor layer. Further, it is desired to be a material such that the surface roughness of the insulation layer would be at most 300 nm, more preferably at most 10 nm. If the surface roughness of the insulation layer exceeds 300 nm, the interface between the insulation layer and the organic semiconductor layer tends to be rough, whereby the transistor characteristics tend to deteriorate. Further, the linear expansion coefficient is preferably at most $25 \times 10^{-5} \cdot cm \cdot cm^{-1} \cdot {}° C.^{-1}$, more preferably at most $10 \times 10^{-5} \cdot cm \cdot cm^{-1} \cdot C.^{-1}$. If the linear expansion coefficient exceeds $25 \times 10^{-5} \cdot cm \cdot cm^{-1} \cdot {}° C.^{-1}$, a dimensional change is likely to take place during the heat treatment at the time of the production, whereby transistor performance tends to be unstable. Further, one having a high adhesive property to the substrate and the electrodes, is desirable. As the method for forming the insulation layer, a forming method suitable for the characteristics of the material may be adopted, such as a coating method such as spin coating or blade coating, a vapor deposition method, a sputtering method, or a printing method such as screen printing or ink jet printing. Preferred is a coating method or a printing method.

The insulation layer thus formed, preferably has an electrical conductivity of at most $10^{-12}$ S/cm, more preferably at most $10^{-14}$ S/cm and a relative dielectric constant of at least 2.0, more preferably at least 2.5, at room temperature, since such properties are related to a leak current to the gate electrode or low gate voltage driving of the field effect transistor.

The upper limit for the thickness of such an insulation layer is preferably at most 4 μm, more preferably at most 2 μm. The lower limit is preferably at least 0.1 μm, more preferably at least 0.2 μm.

The organic semiconductor to form the organic semiconductor layer is not particularly limited, and any known material may be employed so long as it is a π conjugated low molecular weight or high molecular weight semiconductor. For example, it may be a n conjugated low molecular weight compound such as pentacene, oligothiophene, oligothiophene having a substituent, bisdithienothiophene, a dialkylanthradithiophene having a substituent, metal phthalocyanine, benzoporphyrin, fluorinated copper phthalocyanine, N,N'-dialkyl-naphthalene-1,4,5,8-tetracarboxylic acid diimide-substituted compound, 3,4,9,10-perylenetetracarboxylic acid dianhydride, N,N'-dialkyl-3,4,9,10-perylenetetracarboxylic acid diimide, or fullerene, or a π conjugated polymer, such as a high conjugated copolymer such as a regio regular poly (3-alkylthiophene) represented by regio regular poly (3-hexylthiophene), or a poly-9,9'-dialkylfluorene cobithiophene. Among such n conjugated low molecular weigh and high molecular weight compounds, preferred is one which shows, when formed into an organic semiconductor layer, an electrical conductivity in the source electrode-drain electrode direction of at most $10^{-4}$ S/cm and at least $10^{-12}$ S/cm, more preferably at most $10^{-6}$ S/cm and at least $10^{-11}$ S/cm, particularly preferably at most $10^{-7}$ S/cm and at least $10^{-10}$ S/cm. Further, among these n conjugated low molecular weight and high molecular weight compounds, preferred is one which shows, when formed into an organic semiconductor layer, a carrier density obtained from the field effect mobility, the electrical conductivity in the source electrode-drain electrode direction and the charge amount, to be at least $10^7$ cm$^{-3}$ and at most $10^{18}$ cm$^{-3}$, more preferably at least $10^8$ cm$^{-3}$ and at most $10^{17}$ cm$^{-3}$. Further, among these π conjugated low molecular weight and high molecular weight compounds, preferred is one which shows, when formed into an organic semiconductor layer, an activated energy required for charge transfer, obtained from the temperature dependency of the field effect mobility at at most room temperature, to be at most 0.2 eV, particularly preferably at most 0.1 eV.

Still further, with respect to one having a molecular length of at most 40 Å among these high conjugated low molecular weight compounds, preferred is one having a characteristic such that when an organic semiconductor layer is formed on the same insulation layer as the insulation layer employed for the field effect transistor, in the polarized light absorption measured by introducing an incident light at an angle of 60° against the normal line to the layer surface, p polarized light component/s polarized light component i.e. the ratio of the p polarized light component to the s polarized light component of the absorption peak intensity derived from the transition moment in the molecular axis direction of such a π conjugated low molecular weight compound, is at least 0.5, more preferably at least 2.0, particularly preferably at least 3.0.

On the other hand, in the case of a π conjugated high molecular weight compound having a molecular length exceeding 40 Å, preferred is one which has a characteristic such that when an organic semiconductor layer is formed on the same insulation layer as the insulation layer used for the field effect transistor, in the polarized light absorption measured by introducing an incident light from a direction vertical to the layer surface, the source electrode-drain electrode direction component/vertical direction component i.e. the ratio of the source electrode-drain electrode direction component to the direction component vertical thereto, of the absorption peak intensity derived from the transition moment in the main chain direction of such a π conjugated high molecular weight compound, is at least 3.5, more preferably at least 4.5, particularly preferably at least 5.0.

Still further, among these π conjugated low molecular weight and high molecular weight compounds, preferred is one which shows a characteristic such that when an organic semiconductor layer is formed on the same insulation layer as the insulation layer used for the field effect transistor, the distance between the closest molecules or polymers, is at most 3.9 Å, more preferably at most 3.85 Å, particularly preferably at most 3.8 Å.

The lower limit for the thickness of such an organic semiconductor layer is preferably at least 1 nm, more preferably at least 10 nm. Whereas, the upper limit is preferably at most 10 μm, more preferably at most 500 nm.

As the method for forming an organic semiconductor layer by using such an organic semiconductor, in the case of a low molecular weight organic semiconductor, there may, for example, be mentioned a method of forming it by vapor deposition on the insulation layer or on the support substrate by vacuum vapor deposition, or a method for forming it by dissolving it in a solvent, followed by coating by casting, dipping, spin coating or the like. In the case of a high molecular weight organic semiconductor, a method for forming by dissolving it in a solvent followed by coating by casting, dipping, spin coating or the like, may, for example, be mentioned. Further, a method may also be mentioned wherein using the desired low molecular weight precursor or the desired high molecular weight precursor, a layer is formed by the above mentioned suitable method, followed by heat treatment or the like to convert it to the desired organic semiconductor layer.

The basic structure of the field effect transistor of the present invention is one comprising, as provided on a support substrate, an insulation layer, a gate electrode and an organic semiconductor layer separated by the insulation layer, and a source electrode and a drain electrode provided so as to contact the organic semiconductor layer. As its specific structures, those shown in FIGS. 1 to 3 may be mentioned. However, the field effect transistor of the present invention is not limited to the field effect transistors of the structures shown in FIGS. 1 to 3, and a layer other than the layers shown in FIGS. 1 to 3 may be formed.

For example, in the case of a field effect transistor with an organic semiconductor layer exposed, as the field effect transistor shown in FIG. 1 or 2, a protective film may further be formed thereon to minimize the influence of the outside air over the organic semiconductor. In such a case, the material for the protective film may, for example, be a polymer such as an epoxy resin, an acrylic resin, a polyurethane, a polyimide or a polyvinylalcohol, or an inorganic oxide or nitride such as silicon oxide, silicon nitride or aluminium oxide. The method for forming a protective film may, for example, be a coating method or a vacuum vapor deposition method.

EXAMPLES

Now, the present invention will be described in further detail with reference to Examples. However, it should be understood that the present invention is by no means restricted to the following Examples.

The following resins were used for various evaluations.

Polyethylene terephthalate (PET): SP-976-3 (manufactured by Mitsubishi Kasei Corporation)

Polyimide (PI): KAPTON manufactured by E.I. du Pont de Nemours & Company, Inc.

Polystylene (PS): manufactured by ALDRICH Chemical Company, Inc., Mw=28,000 (GPC method)

Cyanopullulan (CYEPL): CYANORESIN CR-S, manufactured by Shin-Etsu Chemical Co., Ltd.

Polycarbonate (PC): manufactured by ALDRICH Chemical Company, Inc., Mw=64,000 (GPC method)

Polyvinylphenol (PVP): manufactured by ALDRICH Chemical Company, Inc., Mw=20,000 (GPC method)

Elongation at the Yield Point

The elongation at the yield point of each of the following materials 1 to 7 was obtained by taking an average value in 10 tensile tests according to JIS-K7113.

Polystyrene (PS) was dissolved in chloroform at a concentration of 15 wt %, followed by filtration by a filter of 0.45 μm. This PS solution was put on a glass of 10×10 cm$^2$ in an amount of 5 ml, followed by spin coating at 1,000 rpm for 120 sec. Vacuum drying was carried out for 24 hours in a vacuum dryer, and then, the PS film-attached glass plate was immersed in pure water to carry out peeling treatment of the PS film. The peeled PS film was vacuum-dried for 24 hours in a vacuum dryer, and then, the thickness of the PS film was measured by a micrometer (manufactured by Anritsu) and found to be 20 μm. With respect to this film, the elongation at the yield point was measured, and the result is shown in Table 1.

A CYEPL film was obtained in the same manner as in the above 1 except that in the above 1, instead of polystylene, cyanopillulan (CYEPL) was dissolved in a mixed solvent of dimethylformamide (DMF): acetonitrile (1:1) at a concentration of 5 wt %, and the elongation at the yield point was measured. The result is shown in Table 1. The film thickness was 30 μm.

In the above 1, instead of polystyrene, polycarbonate (PC) was dissolved in chloroform at a concentration of 15 wt %. The film thickness was 20 μm.

Polyvinylphenol (PVP) and, as a cross-linking agent, poly (melamine-co-formaldehyde) methacrylate (manufactured by ALDRICH Chemical Company, Inc.) (blend ratio 4:1) were dissolved in tetrahydrofuran (THF) at a concentration of 15 wt %, followed by filtration by a filter of 0.45 μm. 5 ml of this PVP solution was put on a glass plate of 10×10 cm$^2$ and subjected to spin coating at 1,000 rpm for 120 sec. Then, heat treatment was carried out at 120° C. for three minutes to obtain a PVP thermally cross-linked film. After vacuum drying for 24 hours in a vacuum dryer, the PVP film-attached glass plate was immersed in pure water to carry out peeling treatment of the PVP cross-linked film. The peeled PVP cross-linked film was vacuum-dried for 24 hours in a vacuum dryer, and then the thickness of the PVP cross-linked film was measured by a micro meter (manufactured by Auritsu) and was found to be 20 μm. As a low cross-linked PVP film, the elongation at the yield point of this film was measured, and the result is shown in Table 1.

A highly cross-linked PVP film was obtained in the same manner as in the above 4, except that in the above 4, the blend ratio of the polyvinylphenol (PVP) and as the crosslinking agent, the poly (melamine-co-formaldehyde) methacrylate (manufactured by ALDRICH Chemical Company, Inc.), was changed to 3:2, and the concentration was changed to 5%. The elongation at the yield point was measured, and the result is shown in Table 1. The film thickness was 20 µm.

A polyethylene terephthalate (PET) film (film thickness: 200 µm) was cut out in a size of 10×10 cm$^2$, and the elongation at the yield point was measured. The result is shown in Table 1.

A polyimide (PI) film (film thickness: 100 µm) was cut out in a size of 10×10 cm$^2$, and the elongation at the yield point was measured. The result is shown in Table 1.

Further, in Table 1, the elongation at the yield point of each resin material is shown together with the value shown in a literature, and the relative dielectric constant is also shown.

TABLE 1

| | Elongation ϵ (%) according to JIS K7113 (elongatino at yield) | Elongation ϵ (%) according to data handbook, etc. (elongation at yield as disclosed in a literature) | Relative dielectric constant |
|---|---|---|---|
| Polyethylene terephthalate (PET) | 3.1 | 1.4 to 3.8 | 4.3 |
| Polyimide (PI) | 2 | 2 | 3.3 |
| Polystylene (PS) | 1.1 | 0.5 to 1.8 | 2.6 |
| Polycyanopullutan (CYEPL) | 4.5 | 4.8 | 18.5 |
| Polycarbonate (PC) | 6 | 7 to 15 | 2.9 |
| Low cross-linked polyvinyl phenol (PVP) | 2.3 | nil | 3.6 |
| Highly cross-linked polyvinyl phenol (PVP) | 1.8 | nil | 3.6 |

Evaluation of the transistor was carried out with respect to the following items.

Bending Test According to JIS K6744

A support substrate provided with an insulation film was mounted on a metal V block prepared in accordance with JIS K6744, and by changing the load, a bending test was carried out up to immediately before the support plate reached the yield point. In the case of a PET substrate, the bending test was carried out so that the elongation at the yield point became 2.6%, and in the case of a PI substrate, the bending test was carried out so that the elongation at the yield point became 1.7%, whereby the following judgement was made.
  ○: No peeling of the insulation film from the support substrate was observed.
  X: Peeling of the insulation film from the support substrate was observed, or cracking was observed on the surface.

Observation of the Surface Shape

An observation of the surface shape before and after the bending test according to JIS K6744 was carried out by an atomic force microscope (AFM) manufactured by Seiko Instruments Inc.

Measurement of Electric Resistance of Insulation Film by Bending Test

The electric resistance of the insulation film before and after the bending test according to JIS K6744, was measured. A shadow mask having a width of 1 mm was used to cross a gate electrode, and 1,000 Å of an aluminum electrode was vapor-deposited by means of a vacuum vapor deposition machine EX-400 (vacuum degree: 10$^{-6}$ Torr) manufactured by ULVAC, whereupon measurements were made between the electrodes by means of a semiconductor parameter analyzer 4155 manufactured by Agilent to obtain a voltage-current curve, whereby the electrical conductivity was calculated.

Transistor Characteristics

On a substrate subjected to the bending test according to JIS K6744 and a substrate not subjected to such a bending test, pentacene was vapor-deposited in a thickness of 1,000 Å as a semiconductor layer by means of a vacuum vapor deposition machine EX-400 (vacuum degree: 10$^{-6}$ Torr) manufactured by ULVAC at a rate of 1 Å/sec from a crucible. In order to form source/drain electrodes on this semiconductor layer, using a shadow mask of channel (L: 1,000 µm, W: 50 µm), gold was vapor-deposited in a thickness of 1,000 Å, to obtain an organic transistor. This transistor element was measured by a semiconductor parameter analyzer 4155, manufactured by Agilent to obtain a voltage-current curve, whereby the change in the transistor characteristics before and after the bending, was evaluated.

Example 1

A polyethylene terephthalate (PET) film having a thickness of 200 µm, was cut out in a size of 2.5×2.5 cm$^2$. This PET film was used as a support substrate, and after covering it with a shadow mask having a width of 1 mm, aluminum was vapor-deposited in a thickness of 1,000 Å by means of a vacuum vapor deposition machine EX-400 (vacuum degree: 10$^{-6}$ Torr) manufactured by ULVAC, to prepare a gate electrode. A cyanopullulan (CYEPL) solution having dissolved at a concentration of 5 wt % in a mixed solvent of dimethylformamide (DMF): acetonitrile=1:1, followed by filtration by a filter of 0.45 µm, was put thereon in an amount of 5 ml and subjected to spin coating at 3,000 rpm for 120 sec to prepare an insulation film. The thickness of the PS layer was measured by a thickness meter (Alpha-Step 500, manufactured by Tencor) and found to be 5,000 Å.

With respect to the support substrate provided with the insulation film thus prepared, the bending test and the measurement of transistor characteristics were carried out in accordance with JIS K6744. The results are shown in Table 2. Further, the surface shape was observed, whereby no difference in the surface state was observed as between before and after the bending. Further, the measurement of electric resistance of the insulation film by a bending test was carried out, whereby the electrical conductivity before the bending was 6×10$^{-14}$ S/cm, while the electrical conductivity after the bending was 5×10$^{-14}$ S/cm, and thus the change was small.

Example 2

A PET support substrate provided with a PC insulation film, was prepared in the same manner as in Example 1 except that in Example 1, the CYEPL solution was changed to a solution of polycarbonate (PC) dissolved in chloroform at a concentration of 5 wt %. The bending test and the measurement of transistor characteristics were carried out in accordance with JIS K6744. The results are shown in Table 2. The film thickness of the PC layer was 4,000 Å.

Example 3

A PI support substrate provided with a CYEPL insulation film, was prepared in the same manner as in Example 1 except that in Example 1, the PET film was changed to a polyimide (PI) film. The bending test and the measurement of transistor characteristics were carried out in accordance with JIS K6744. The results are shown in Table 2. The thickness of the CYEPL layer was 5,000 Å. Further, the surface shape was observed, whereby no difference in the surface state was observed as between before and after the bending. Further, measurements of the electric resistance of the insulation film by a bending test was carried out, whereby the electrical conductivity before the bending was $6 \times 10^{-14}$ S/cm, while the electrical conductivity after the bending was $5 \times 10^{-14}$ S/cm, and thus the change was small.

Example 4

A PI support substrate provided with a PC insulation film, was prepared in the same manner as in Example 1 except that in Example 1, the PET film was changed to a polyimide (PI) film, and the CYEPL solution was changed to a solution of polycarbonate (PC) dissolved in chloroform at a concentration of 5 wt %. The bending test and the measurement of transistor characteristics were carried out in accordance with JIS K6744. The results are shown in Table 2. The thickness of the PC layer was 4,000 Å.

Example 5

A PI support substrate provided with a low cross-linked PVP insulation film, was prepared in the same manner as in Example 1 except that in Example 1, the PET film was changed to a polyimide (PI) film, the CYEPL solution was changed to a solution having PVP and poly (melamine-co-formaldehyde) methacrylate (manufactured by ALDRICH Chemical Company, Inc.) (blend ratio 4:1) dissolved in tetrohydrofuran (THF) at a concentration of 5 wt %, and after spin coating this solution, heat treatment was carried out at 120° C. for 3 minutes to obtain a PVP thermally cross-linked film. The bending test and the measurement of transistor characteristics were carried out in accordance with JIS K6744. The results are shown in Table 2. The film thickness of the low cross-linked PVP layer was 300 Å.

Comparative Example 1

A PET support substrate provided with a PS insulation film, was prepared in the same manner as in Example 1 except that in Example 1, the CYEPL solution was changed to a solution of polystyrene (PS) dissolved in chloroform at a concentration of 5 wt %. The bending test and the measurement of transistor characteristics were carried out in accordance with JIS K6744. The results are shown in Table 2. The thickness of the PS layer was 3,000 Å. Further, the surface shape was observed, whereby irregularities or cracks were observed on the surface after the bending, while the surface was flat before the bending. Further, measurements of the electric resistance of the insulation film by a bending test were carried out, whereby the electrical conductivity before the bending was $5 \times 10^{-14}$ S/cm, while after the bending, the electrical conductivity up to −1.5 V, was $1 \times 10^{-12}$ S/cm due to dielectric breakdown.

Comparative Example 2

A PET support substrate provided with a low cross-linked PVP insulation film, was prepared in the same manner as in Example 1 except that in Example 1, the CYEPL solution was changed to a solution having polyvinylphenol (PVP) and, as a cross-linking agent, poly (melamine-co-formamide) methacrylate (manufactured by ALDRICH Chemical Company, Inc.) (blend ratio 4:1), dissolved in THF at a concentration of 5 wt %, and further, after spin coating this solution, heat treatment was carried out at 120° C. for 3 minutes to form a PVP thermally cross-linked film. The bending test and the measurement of transistor characteristics were carried out according to JIS K6744. The results are shown in Table 2. The thickness of the low cross-linked PVP layer was 3,000 Å.

Comparative Example 3

A PET support substrate provided with a highly cross-linked PVP insulation film, was prepared in the same manner as in Example 1 except that in Example 1, the CYEPL solution was changed to a solution having polyvinylphenol (PVP) and, as a cross-linking agent, poly (melamine-co-formaldehyde) methacrylate (manufactured by ALDRICH Chemical Company, Inc.) (blend ratio 3:2), dissolved in THF at a concentration of 5 wt %, and further, after spin coating this solution, heat treatment was carried out at 120° C. for 3 minutes to form a PVP thermally cross-linked film. The bending test and the measurement of transistor characteristics were carried out in accordance with JIS K6744. The results are shown in Table 2. The thickness of the highly cross-linked PVP layer was 3,000 Å.

Comparative Example 4

A PI support substrate provided with a PS insulation film, was prepared in the same manner as in Example 1 except that in Example 1, the PET film was changed to a PI film, and the CYEPL solution was changed to a solution of polystyrene (PS) dissolved in chloroform at a concentration of 5 wt %. The bending test and the measurement of transistor characteristics were carried out in accordance with JIS K6744. The results are shown in Table 2. The thickness of the PS layer was 3,000 Å. Further, the surface shape was observed, whereby, irregularities or cracks were observed on the surface after bending, while the surface before the bending was flat. Further, measurements of the electric resistance of the insulation film by a bending test, were carried out, whereby the electrical conductivity before the bending was $5 \times 10^{-14}$ S/cm, while after the bending, the electrical conductivity to −1.5 V was $1 \times 10^{-12}$ S/cm due to dielectric breakdown.

Comparative Example 5

A PI support substrate provided with a highly cross-linked PVP insulation film, was prepared in the same manner as in Example 1 except that in Example 1, the PET film was changed to a PI film, the CYEPL solution was changed to a solution having polyvinylphenol (PVP) and, as a cross-linking agent, poly (melamine-co-formaldehyde) methacrylate (manufactured by ALDRICH Chemical Company, Inc.) (blend ratio 3:2), dissolved in THF at a concentration of 5 wt %, and further, after spin coating this solution, heat treatment was carried out at 120° C. for 3 minutes to form a PVP thermally cross-linked film. The bending test and the measurement of transistor characteristics were carried out in accordance with JIS K6744. The results are shown in Table 2. The thickness of the highly cross-linked PVP layer was 3,000 Å.

TABLE 2

| | Substrate ($\epsilon 2$) | Insulation layer ($\epsilon 1$) | $\epsilon 1/\epsilon 2$ | JIS6744 bending test | Change in transistor performance |
|---|---|---|---|---|---|
| Ex. 1 | PET (3.1) | CYEPL (4.5) | 1.5 | ○ | −10% |
| Ex. 2 | PET (3.1) | PC (6) | 1.9 | ○ | −3% |
| Ex. 3 | PI (2) | CYEPL (4.5) | 2.3 | ○ | −10% |
| Ex. 4 | PI (2) | PC (6) | 3.0 | ○ | −4% |
| Ex. 5 | PI (2) | Low cross-linked PVP (2.3) | 1.2 | ○ | −7% |
| Comp Ex. 1 | PET (3.1) | PS (1.1) | 0.4 | X | Not measurable |
| Comp Ex. 2 | PET (3.1) | Low cross-linked PVP (2.3) | 0.7 | X | Not measurable |
| Comp Ex. 3 | PET (3.1) | Highly cross-linked PVP (1.8) | 0.6 | X | Not measurable |
| Comp Ex. 4 | PI (2) | PS (1.1) | 0.6 | X | Not measurable |
| Comp Ex. 5 | PI (2) | Highly cross-linked PVP (1.8) | 0.9 | X | Not measurable |

Folding Tests According to JIS C2103

The relation between the elongation (%) and the insulation resistance with PS and CYEPL was investigated in accordance with the folding test according to JIS C2103 which is carried out for evaluation of an insulation varnish.

In accordance with JIS C2103, PS or CYEPL was spin-coated as an insulation film on a metal plate under the same conditions as the conditions for preparation of a transistor, and then as a counter electrode, gold was vapor-deposited in a thickness of 1,000 Å by means of a vacuum vapor deposition machine EX-400 (vacuum degree: $10^{-6}$ Torr) manufactured by ULVAC. On the counter electrode, a lead wire was fixed by a DOTITE adhesive (manufactured by FUJIKURAKASEI CO., LTD.) and connected to a prober for measuring the current. While gradually bending the substrate, the current was measured by a semiconductor parameter analyzer 4155 manufactured by Agilent, whereby the results were plotted.

As a result, deterioration in the insulation resistance was observed from the elongation at yield of PS being 1.1%. On the other hand, with CYEPL, deterioration in the insulation resistance was observed from about the elongation being beyond 3.5%.

INDUSTRIAL APPLICABILITY

As described in detail in the foregoing, according to the filed effect transistor of the present invention, the mechanical characteristics of the support substrate and the insulation layer which occupy a large area as constituting components of a switching element in a flexible display and which are susceptible to mechanical influences, are optimized, whereby a high mobility, a high on-current and a low leak current, and a high on/off ratio, in an organic field effect transistor, can be accomplished, and it is possible to provide an organic field effect transistor having such transistor characteristics stabilized.

The entire disclosure of Japanese Patent Application No. 2002-223021 filed on Jul. 31, 2002 including specification, claims, drawings and summary is incorporated herein by reference in its entirety.

What is claimed is:

1. A field effect transistor comprising an insulation layer, a gate electrode and an organic semiconductor layer separated by the insulation layer, a source electrode and a drain electrode provided so as to contact the organic semiconductor layer, and a support substrate containing a polymer, wherein elongation $\epsilon 1$ (%) at the yield point of the insulation layer is larger than elongation $\epsilon 2$ (%) at the yield point of the support substrate.

2. The field effect transistor according to claim 1, wherein the ratio ($\epsilon 1/\epsilon 2$) of elongation $\epsilon 1$ (%) at the yield point of the insulation layer to elongation $\epsilon 2$ (%) at the yield point of the support substrate, is at least 1.

3. The field effect transistor according to claim 1, wherein the ratio ($\epsilon 1/\epsilon 2$) of elongation $\epsilon 1$ (%) at the yield point of the insulation layer to elongation $\epsilon 2$ (%) at the yield point of the support substrate, is at most 15.

4. The field effect transistor according to claim 1, wherein the insulation layer has a thickness of from 0.1 to 4 µm.

5. The field effect transistor according to claim 1, wherein the support substrate has a thickness of from 0.01 to 2 mm.

6. The field effect transistor according to claim 1, wherein the gate electrode is provided on the support substrate, and the organic semiconductor layer is provided on the gate electrode via the insulation layer.

7. The field effect transistor according to claim 1, wherein the source electrode and the drain electrode are in contact with the insulation layer.

8. The field effect transistor according to claim 1, wherein the source electrode and the drain electrode are provided on the organic semiconductor layer.

9. The field effect transistor according to claim 1, wherein the source electrode and the drain electrode are provided on the support substrate.

10. The field effect transistor according to claim 1, wherein the support substrate is a plastic substrate selected from the group consisting of a polyester, a polycarbonate, a polyimide, an amorphous polyolefin, a polyether sulfone, an epoxy resin, a polyamide, a polybenzoxazole, a polybenzothiazole, a vinyl polymer, a polyparabanic acid, a polysilsesquioxane and a siloxane.

11. The field effect transistor according to claim 1, wherein the relative dielectric constant in the insulation layer is at least 0.2.

12. The field effect transistor according to claim 1, wherein the electrical conductivity in the insulation layer is at most $10^{-12}$ S/cm.

* * * * *